(12) United States Patent
Johnson et al.

(10) Patent No.: US 7,656,226 B2
(45) Date of Patent: Feb. 2, 2010

(54) SWITCHED CAPACITOR EQUALIZER WITH OFFSET VOLTAGE CANCELLING

(75) Inventors: Luke A Johnson, Queen Creek, AZ (US); Yueming He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 416 days.

(21) Appl. No.: 11/396,393

(22) Filed: Mar. 31, 2006

(65) Prior Publication Data

US 2007/0229046 A1 Oct. 4, 2007

(51) Int. Cl.
 *H03F 1/02* (2006.01)
(52) U.S. Cl. ......................................................... 330/9
(58) Field of Classification Search ...................... 330/9; 327/124, 307
 See application file for complete search history.

(56) References Cited

U.S. PATENT DOCUMENTS

| | | | | |
|---|---|---|---|---|
| 4,607,231 A | * | 8/1986 | Nakayama | 330/51 |
| 4,768,205 A | * | 8/1988 | Nakayama | 375/232 |
| 4,835,482 A | * | 5/1989 | Tamakoshi et al. | 327/554 |
| 4,965,711 A | * | 10/1990 | Kamp et al. | 363/60 |
| 5,410,270 A | * | 4/1995 | Rybicki et al. | 330/9 |
| 5,457,417 A | * | 10/1995 | Guoliang et al. | 327/356 |
| 5,604,458 A | * | 2/1997 | Shou et al. | 327/356 |
| 5,739,720 A | * | 4/1998 | Lee | 330/9 |
| 5,760,657 A | | 6/1998 | Johnson | |
| 5,784,320 A | | 7/1998 | Johnson | |
| 5,923,275 A | * | 7/1999 | Kalb | 341/150 |
| 5,994,939 A | | 11/1999 | Johnson et al. | |
| 6,075,476 A | | 6/2000 | Johnson et al. | |
| 6,081,162 A | | 6/2000 | Johnson | |
| 6,144,195 A | | 11/2000 | Afghahi et al. | |
| 6,163,582 A | | 12/2000 | Johnson | |
| 6,166,595 A | * | 12/2000 | Moldsvar et al. | 330/9 |
| 6,184,732 B1 | | 2/2001 | Johnson et al. | |
| 6,194,967 B1 | | 2/2001 | Johnson et al. | |
| 6,208,181 B1 | | 3/2001 | Johnson | |
| 6,232,757 B1 | | 5/2001 | Afghahi et al. | |
| 6,232,826 B1 | | 5/2001 | Afghani et al. | |
| 6,249,159 B1 | | 6/2001 | Johnson | |
| 6,255,873 B1 | | 7/2001 | Johnson et al. | |
| 6,288,666 B1 | | 9/2001 | Afghahi et al. | |
| 6,310,514 B1 | | 10/2001 | Johnson | |
| 6,342,848 B1 | | 1/2002 | Johnson et al. | |
| 6,362,666 B1 | | 3/2002 | Afghahi et al. | |
| 6,417,675 B1 | | 7/2002 | Johnson | |
| 6,496,046 B2 | | 12/2002 | Johnson | |
| 6,498,824 B1 | | 12/2002 | Johnson | |
| 6,516,672 B2 | * | 2/2003 | Wang | 73/718 |

(Continued)

*Primary Examiner*—Robert Pascal
*Assistant Examiner*—Khiem D Nguyen
(74) *Attorney, Agent, or Firm*—Schwegman, Lundberg & Woessner, P.A.

(57) ABSTRACT

An embodiment may be described as a switched capacitor analog equalizer circuit with offset voltage cancellation, where an embodiment comprises an amplifier in which a feedback path from its output port to one of its input ports is provided during a reset phase, and where the amplifier's input port connected to the feedback path is also connected to one terminal of an offset-correction capacitor and one terminal of a sampling capacitor. The other terminal of the offset-correction capacitor is connected to a switch and the other terminal of the sampling capacitor is connected to an input port to receive a signal. During the reset phase, the switch is open, and during a sampling phase, the switch is closed so that the offset-correction capacitor and the sampling capacitor are connected in parallel. Other embodiments are described and claimed.

18 Claims, 4 Drawing Sheets

U.S. PATENT DOCUMENTS

| | | |
|---|---|---|
| 6,518,806 B2 | 2/2003 | Johnson |
| 6,535,039 B2 * | 3/2003 | Nanba et al. ................ 327/170 |
| 6,545,627 B1 | 4/2003 | He et al. |
| 6,731,688 B1 | 5/2004 | Johnson |
| 6,946,986 B2 * | 9/2005 | Gabillard et al. ............ 341/150 |
| 7,245,321 B2 * | 7/2007 | Panicacci et al. ............ 348/241 |
| 7,302,246 B2 | 11/2007 | Tseng et al. |
| RE40,249 E * | 4/2008 | Cannata et al. ............. 250/332 |
| 2002/0085655 A1 | 7/2002 | Johnson |
| 2005/0023460 A1 | 2/2005 | Brown et al. |
| 2005/0071706 A1 | 3/2005 | Deshmane et al. |
| 2005/0146385 A1 | 7/2005 | Johnson et al. |
| 2008/0231356 A1 * | 9/2008 | Querbach et al. .............. 330/9 |

* cited by examiner

SWITCHED CAPACITOR EQUALIZER WITH OFFSET VOLTAGE CANCELLING

FIELD

Embodiments relate to analog circuits, and more particularly, to a switched capacitor equalizer and offset canceling sampler.

BACKGROUND

Computer systems currently employ different kinds of communication links between various components within a computer system. Some of these communication links are, or have been, multi-drop, parallel busses. However, with increasing processing power and higher capacity data links, it is expected that serial, point-to-point busses will be employed in place of some multi-drop, parallel busses. One such multi-drop bus, the PCI (Peripheral component Interconnect) bus, is expected to be replaced with the PCI Express bus. (PCI and PCI Express are registered trademarks belonging to the PCI SIG Corporation. See www.pci-sig.com.)

The physical layer specified by the PCI Express Architecture is a point-to-point serial data bus employing differential signaling in each direction. A lane in the physical layer comprises two low-voltage differentially driven communication links, or channels. This is illustrated in FIG. 1, where device A comprises a differential transmitter Tx to transmit a differential signal to device B, and comprises a receiver Rx to receive a differential signal from device B. Device B also comprises a differential transmitter Tx and a differential receiver Rx. The resistors in FIG. 1 indicate termination resistors.

The data transmitted in the PCI Express link is in the form of packets, where 8 b/10 b encoding is employed so that 8 information bits are encoded into 10 channel bits to equalize the number of 1's and 0's sent. The encoded signal contains an embedded clock. It is expected that a single lane in the PCI Express Architecture will support a data rate of 2.5 Gbps (Giga bits per second). Higher data rates between devices may be realized by employing more than one physical lane.

Recovering the transmitted information from a high speed serial link is not necessarily a straightforward task, particularly in those cases in which the channel capacity of the transmission medium may be limited. Channel capacity may be limited if the bandwidth of the transmission channel, such as for example a transmission line comprising copper wires, is below that of the transmitted data rate. Such bandlimited channels may result in intersymbol interference. In such cases, channel equalization is a method to mitigate the effects of intersymbol interference.

In many applications, recovering data at the receiving end involves sampling the received data signal, establishing common mode levels to optimal bias levels, canceling offset errors in comparators, equalizing data-dependent jitter, and amplifying the filtered output to full CMOS (Complementary Metal Oxide Semiconductor) voltage levels. Performing some or all of these signal processing operations with dedicated discrete circuit blocks may not be an ideal solution because of power consumption and required die area, and because of the noise and distortion that may be introduced.

It is desirable to provide a circuit to perform some or all of these functions that is relatively small and consumes relatively little power.

BRIEF DESCRIPTION OF THE DRAWINGS

FIG. 5b illustrates a timing diagram for switching signals in FIG. 5a.

DESCRIPTION OF EMBODIMENTS

Figure 1:
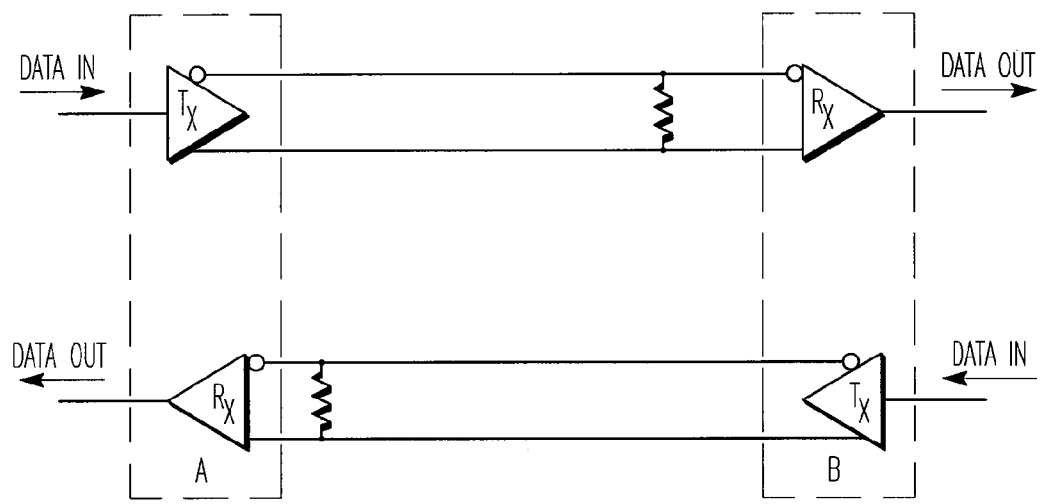
FIG. 1 illustrates a two-way serial communication link.
Figure 2:
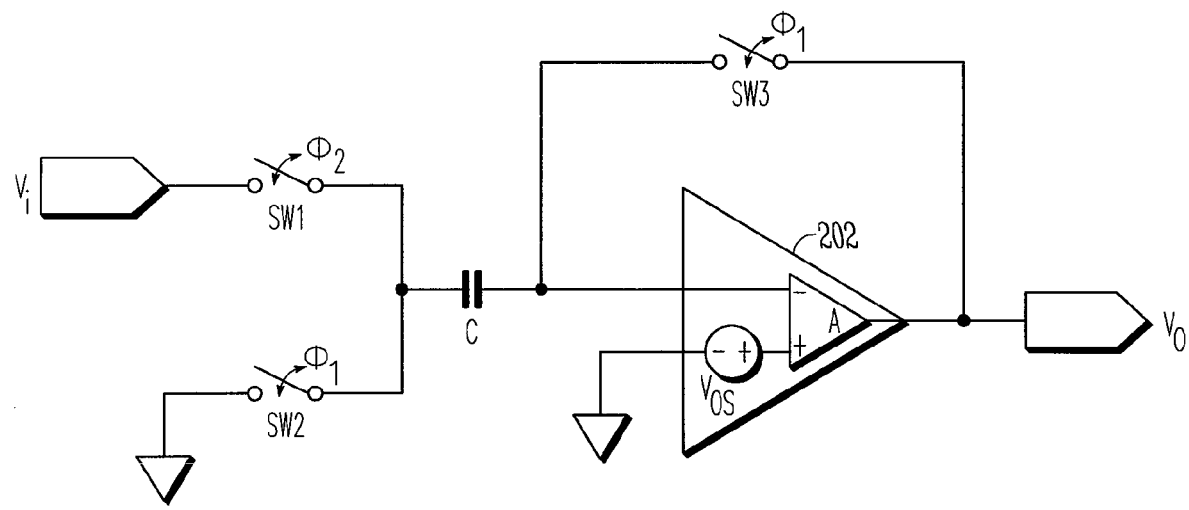
FIG. 2 illustrates a prior art voltage offset canceller.

Before providing a description of an embodiment of the present invention, it is pedagogically useful to first consider a well-known circuit: the offset canceling comparator. An offset canceling comparator is illustrated in FIG. 2, comprising amplifier 202, switches SW1, SW2, and SW3, and capacitor C. Switches SW2 and SW3 are closed only when clock signal $\Phi_1$ is HIGH, and switch SW1 is closed only when clock signal $\Phi_2$ is HIGH, where the clock signals $\Phi_1$ and $\Phi_2$ are out of phase with respect to each other so that at any given time at most only one of them is HIGH.

Amplifier 202 is modeled as an ideal amplifier having a gain A, and with an offset voltage $V_{OS}$, as indicated in FIG. 2. The inverting input port of amplifier 202 is connected to one terminal of capacitor C and is coupled via switch SW3 to the output port labeled by output voltage Vo. The non-inverting input port of amplifier 202 is held at some fixed voltage, which in the example of FIG. 2 is the ground voltage. One terminal of switch SW2 is grounded and its other terminal is connected to capacitor C, and one terminal of switch SW1 is connected to the input port labeled by input voltage Vi and its other terminal is connected to capacitor C.

When $\Phi_1$ is HIGH, one terminal of capacitor C is grounded and there is a feedback path from the output port to the inverting input port of amplifier 202, so that capacitor C is charged to a voltage equal to $[A/(A+1)]V_{OS}$. Consequently, for large gain where A>>1, capacitor C is charged approximately to the offset voltage $V_{OS}$. After capacitor C has been charged to $V_{OS}$, when $\Phi_1$ goes LOW and $\Phi_2$ goes HIGH so that the inverting input port of amplifier 202 is decoupled from the output port and capacitor C is coupled to the input port, the output voltage Vo is given by $-A[Vi-V_{OS}/(A+1)]$, which for large gain A is approximately $-A(Vi)$. In this way, by storing the offset voltage $V_{OS}$ on capacitor C when $\Phi_1$ is HIGH, the output voltage is not affected by the offset voltage when $\Phi_2$ is HIGH.

Figure 3:
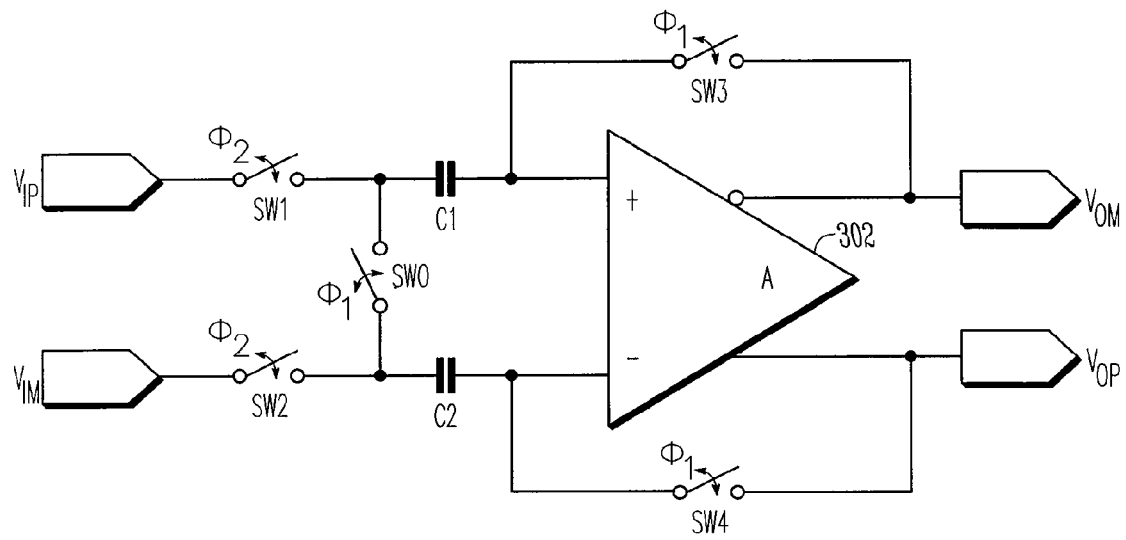
FIG. 3 illustrates a prior art voltage offset canceller for differential signaling.

A differential version of the offset comparator of FIG. 2 is provided in FIG. 3, where for simplicity the offset voltage $V_{OS}$ is not explicitly shown, but is assumed to be inherent in amplifier 302. In FIG. 3, switches SW0, SW3, and SW4 are controlled by clock signal $\Phi_1$, and switches SW1 and SW2 are controlled by clock signal $\Phi_2$. Capacitors C1 and C2 have the same capacitance. Assuming the gain A is much greater than one, when $\Phi_1$ is HIGH, the voltage drops stored on capacitors C1 and C2, denoted as $V_{C1}$ and $V_{C2}$, respectively, are such that $V_{C1}-V_{C2} \approx V_{OS}$. When $\Phi_2$ goes HIGH, the output voltages $V_{OM}$ and $V_{OP}$ in terms of input voltages $V_{IP}$ and $V_{IM}$ are given by $V_{OM} \approx -A[V_{IP}-V_{IM}]$ and $V_{OP}=A[V_{IP}-V_{IM}]$.

Figure 4:
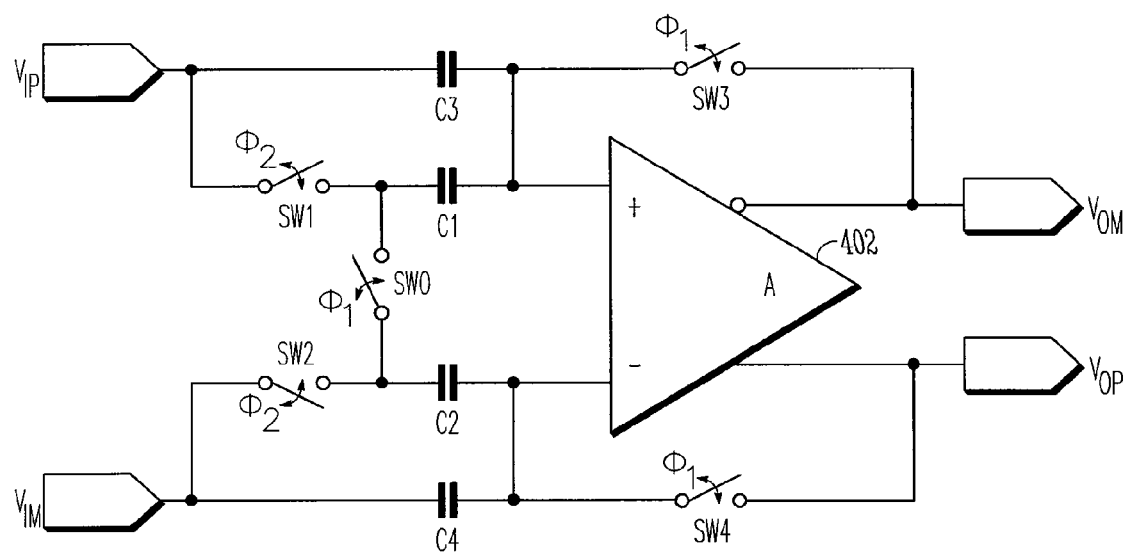
FIG. 4 illustrates an embodiment of the present invention.

We now describe an embodiment of the present invention, as illustrated in FIG. 4. We assume that amplifier 402 has an offset voltage $V_{OS}$, but for simplicity it is not explicitly shown. The gain of amplifier 402 is denoted as A. Capacitors C1 and C2 are matched to each other to have the same capacitance, which we denote as $C_I$, and capacitors C3 and C4 are also matched to each other to have the same capacitance, which we denote as $C_E$. Switches SW0, SW3, and SW4 are controlled by clock signal $\Phi_1$, and switches SW1 and SW2 are controlled by clock signal $\Phi_2$.

In FIG. 4, the terminals of capacitors C1 and C2 that are connected to each other are shown as floating when switches SW1 and SW2 are open. In practice, another switch may be introduced so that these terminals are connected to a reference voltage, such as ground, only when switches SW1 and SW2 are open. For simplicity in the drawings, this switch is not shown, but some embodiments may employ such a switch.

Denoting the input voltages by $V_{IP}$ and $V_{IM}$ as indicated in FIG. 4, when clock signal $\Phi_1$ is HIGH, the voltage drops across capacitors C1 and C2, denoted as $V_{C1}$ and $V_{C2}$, respectively, are such that for large gain A, $V_{C1}-V_{C2} \approx V_{OS}$. Also when clock signal $\Phi_1$ is HIGH and the gain A is large, the voltage drops across capacitors C3 and C4, denoted as $V_{C3}$ and $V_{C4}$, respectively, are such that $V_{C3}-V_{C4} \approx V_{IM}-V_{IP}+V_{OS}$.

Suppose now that the clock signals transition so that clock signal $\Phi_1$ goes LOW and clock signal $\Phi_2$ goes HIGH. The input voltages $V_{IP}$ and $V_{IM}$ will, in general, change in value from what they were before the clock transition. To distinguish these new values, a time discrete time index n is introduced, so that we may represent the old input voltage values as $V_{IP}[n-1]$ and $V_{IM}[n-1]$ and the new voltage values as $V_{IP}[n]$ and $V_{IM}[n]$. This notation may be applied to the other voltages in the circuit. With this notation, we have before the clock transition the relationships $V_{C1}[n-1]-V_{C2}[n-1] \approx V_{OS}$ and $V_{C3}[n-1]-V_{C4}[n-1] \approx V_{IM}[n-1]-V_{IP}[n-1]+V_{OS}$. For the new clock transition, switches SW1 and SW2 close, and switches SW0, SW3, and SW4 open, and as a result there is, in general, a transfer of charge among capacitors C1 and C3 such that their voltage drops are equal to each other, and a transfer of charge among capacitors C2 and C4 so that their voltage drops are equal to each other.

The magnitude of the charge transferred among capacitors C1 and C3, denoted as $\Delta Q_{13}$, is $\Delta Q_{13}=|V_{C3}[n-1]-V_{C1}[n-1]|(C_E \| C_I)$, and the magnitude of the charge transferred among C2 and C4, denoted as $\Delta Q_{24}$, is $\Delta Q_{24}=|V_{C4}[n-1]-V_{C2}[n-1]|(C_E \| C_I)$ where $(C_E \| C_I)$ is the capacitance of capacitors C3 and C1 (or C4 and C2) in parallel. As a result of this charge transfer, the new voltage at the non-inverting input port of amplifier 402 at time index n is $V_{IP}[n]+V_{C3}[n-1]-(V_{C3}[n-1]-V_{C1}[n-1])(C_E \| C_I)/C_E$, and the new voltage at the inverting input port of amplifier 402 at time index n at is $V_{IM}[n]+V_{C4}[n-1]-(V_{C4}[n-1]-V_{C2}[n-1])(C_E \| C_I)/C_E$. If y[n] denotes the differential output voltage $y[n]=V_{OP}[n]-V_{OM}[n]$, and x[n] denotes the differential input voltage $x[n]=V_{IP}[n]-V_{IM}[n]$, then from the previous expressions for the voltages at the inverting and non-inverting input ports of amplifier 402 and the relationships $V_{C1}[n-1]-V_{C2}[n-1] \approx V_{OS}$ and $V_{C3}[n-1]-V_{C4}[n-1] \approx V_{IM}[n-1]-V_{IP}[n-1]+V_{OS}$, it follows that $$y[n] \approx 2A(x[n]-Kx[n-1]),$$

where the scalar multiplier K is given by $K=C_E/(C_E+C_I)$.

In the above displayed equation, the discrete-time analog output y[n] is readily identified as the sum of the output of a discrete-time differentiator and the output of a linear amplifier. The effective combination of a discrete-time differentiator with a linear amplifier results in an equalization filter, or equalizer. This equalizer may be employed to help mitigate the effects of intersymbol interference in a bandlimited channel. In practice, this equalizer is commonly used in many transmit pre-emphasis and de-emphasis schemes, but in this particular example, it is being employed at the receiving end.

The knee of the frequency response of an embodiment circuit is determined by the amount of the differentiated signal applied as indicated by scalar K in the above-displayed equation. This scalar is determined by the clock rate and the matching of capacitor C1 with capacitor C3, and capacitor C2 with capacitor C4, instead of being determined by their actual capacitance values. As a result, the knee of the frequency response is expected to be very predictable and insensitive to process, voltage, or temperature variations. A form of adaptive calibration may be employed by implementing different equalization factors (K), where this is easily accomplished by switching in different amounts of capacitance for capacitor $C_E$. Adaptive calibration may find applications to channels that exhibit a relatively large variation from platform to platform, so that the proper frequency response may be selected for a given platform.

For an embodiment of the present invention, we may define two phases of operation: a reset phase and a sampling phase. A reset phase is the phase of operation in which the offset voltage is being stored on capacitors C1 and C2, and in which the input voltages are being stored on capacitors C3 and C4. Stated more precisely, the reset phase is the phase of operation in which the difference in voltage drops across capacitors C1 and C2 is approximately equal to the offset voltage, and the difference in voltage drops across capacitors C3 and C4 is approximately equal to the difference in the input voltages plus the offset voltage. In a sense, the offset voltage information is stored on capacitors C1 and C2, which may be termed offset-correction capacitors. For the embodiment of FIG. 4, switches SW1 and SW2 are open and switches SW0, SW3, and SW4 are closed during the reset phase.

A sampling phase is the phase of operation in which the feedback paths from the output ports to the input ports of the amplifier are open, e.g., switches SW0, SW3, and SW4 are open in FIG. 4, and capacitors C1 and C2 are coupled to the input voltages by closing switches SW1 and SW2 so that the amplifier provides the function of an equalizer. During the sampling phase, the offset voltage is effectively cancelled out in the output voltage of the amplifier.

The differential signal at output ports $V_{OM}$ and $V_{OP}$ may be converted to a CMOS voltage level in various ways. An example embodiment is provided in FIG. 5a, which is a modified version of the embodiment of FIG. 4 with switches SW5 and SW6 and their corresponding interconnects added. These switches are controlled by a fire signal $\Phi_F$. Switches SW5 and SW6 are closed at the end of a sampling phase. When they are closed, the positive output port of amplifier 502 is coupled to its non-inverting input port, and its negative output port is connected to its inverting input port. This results in a positive feedback loop that forces the small differential signal developed during the sampling phase to a full CMOS rail voltage, after which the resulting CMOS output voltage can drive CMOS logic, such as a latch. Switches SW5 and SW6 are then opened before a new reset phase begins.

Figure 5A:
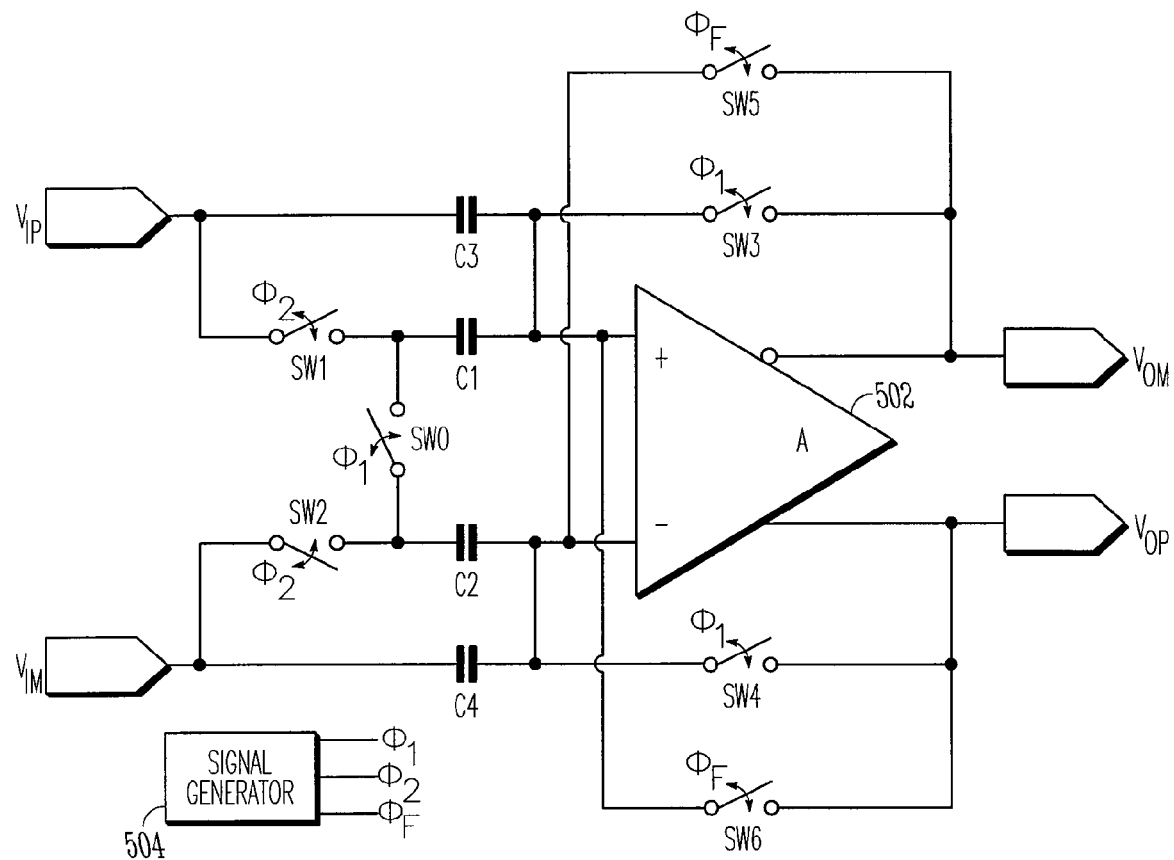
FIG. 5a illustrates another embodiment of the present invention.
Figure 5B:
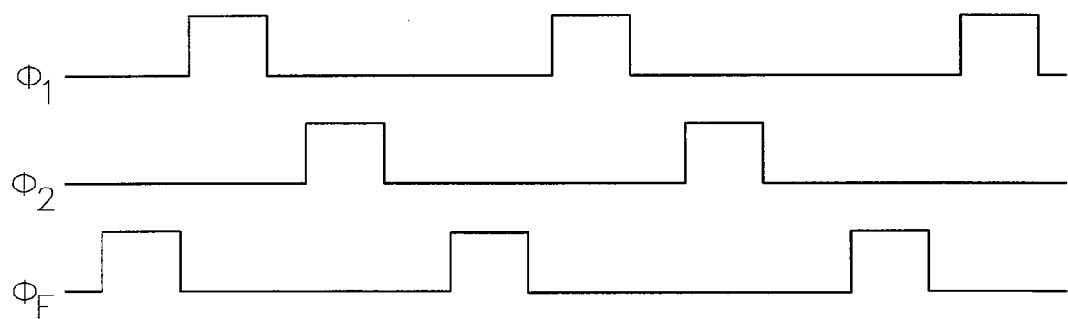

A simplified timing diagram to show the relative timing of signals $\Phi_1$, $\Phi_2$, and $\Phi_F$ is illustrated in FIG. 5b. Generation of the signals $\Phi_1$, $\Phi_2$, and $\Phi_F$ is straightforward, and various well-known methods may be used. The generation of these signals is indicated by signal generator module 504. For simplicity, this module is not explicitly shown in the other circuit diagrams, but may be assumed to be present.

Two instances of the embodiment of FIG. 5*a* may be implemented to filter a received signal on a transmission line. When one instance is in its sampling phase, the other instance is in its reset phase. In this way, each instance provides the function of an equalizer, so that the functional relationship provided by the combination of the instances provides the filtered output $y[n] \approx 2A(x[n]-Kx[n-1])$ for each value of the index n.

Figure 6:
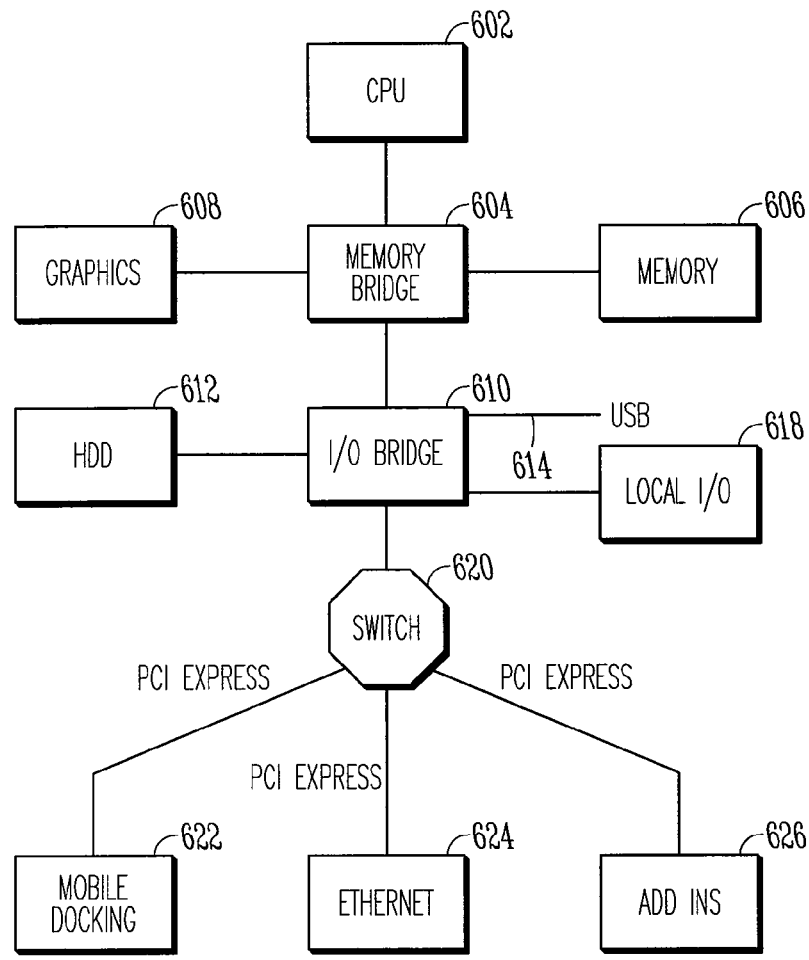
FIG. 6 illustrates a high-level system view of a computer system employing an embodiment of the present invention.

Embodiments of the present invention may find applications in various systems employing serial busses, as for example a computer system such as that illustrated in FIG. 6. In FIG. 6, CPU (Central Processing Unit) 602 communicates with memory bridge 604, allowing access to system memory module 606 and graphics module 608. Input-Output bridge 610 allows communication with other devices, such as HDD (Hard Disc Drive) 612, USB (Universal Serial Bus) port 614, and other local input-output devices indicated by module 618. To communicate with other entities outside the computer system of FIG. 6, input-output bridge 610 provides communication to switch 620, which allows communication to mobile docking module 622, Ethernet module 624, and other add-ins indicated by add-in module 626. Some of the interconnects between these various system components may be multi-drop busses, and others may be point-to-point serial busses, as indicated by the PCI Express interconnects between switch 620 and modules 622, 624, and 626. Embodiments of the present invention may find applications in receivers embedded within switch 620 and modules 622, 624, and 626. Embodiments of the present invention may find applications to other serial busses that may be utilized in other communication links within the computer system of FIG. 6.

Figure 7:
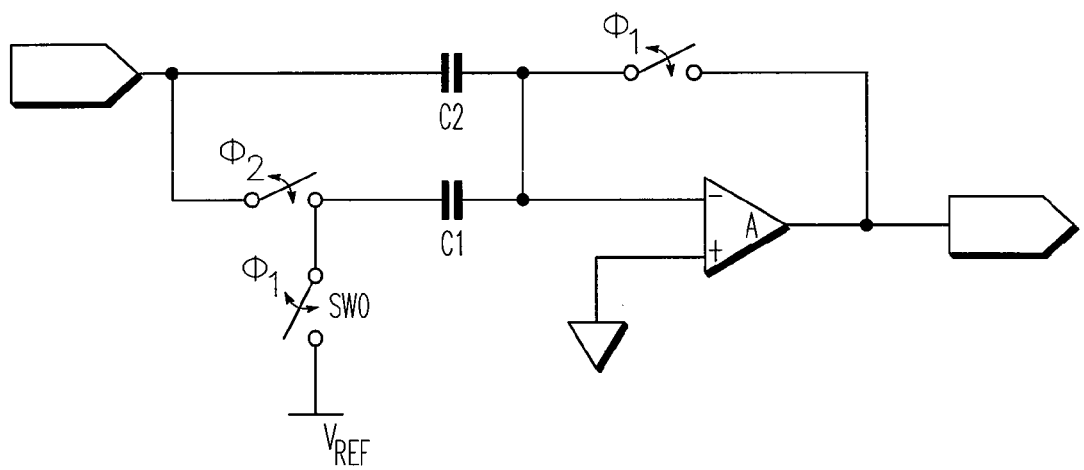
FIG. 7 illustrates another embodiment of the present invention in which single-ended signaling is employed.

Various modifications may be made to the disclosed embodiments without departing from the scope of the invention as claimed below. For example, differential signaling was described, but the embodiments may be modified for single-ended signaling. For example, referring to FIG. 7, a single-ended embodiment comprising capacitors C1 and C2 is realized, where switch SW0 connects capacitor C1 to a reference rail, labeled Vref, during a reset phase. The reference rail may be ground. Another switch may be added to connect the output of the amplifier in FIG. 7 to its non-inverting input port so as to bring the output voltage to the full CMOS voltage level after a sampling phase, as described with respect to the other embodiments.

Realization of the switches described in the embodiments are well-known to one of ordinary skill in the art, and may comprise transistors configured as pass gates.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, for example. In integrated circuit technology, the interconnect may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element which in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Throughout the description of the embodiments, various mathematical relationships are used to describe relationships among one or more quantities. For example, a mathematical relationship may express a relationship by which a quantity is derived from one or more other quantities by way of various mathematical operations, such as addition, subtraction, multiplication, division, etc. More simply, a quantity may be set to some known value, such as a real number, which is merely a trivial mathematical relationship. These numerical relationships are in practice not satisfied exactly, and should therefore be interpreted as "designed for" relationships. That is, one of ordinary skill in the art may design various working embodiments to satisfy various mathematical relationships, but these relationships can only be met within the tolerances of the technology available to the practitioner. In the following claims, the word "substantially" may be used to reflect this fact. For example, a claim may recite that one impedance is substantially equal to, or matched to, another impedance, or that one voltage is substantially equal to another voltage. Or, a claim may relate one quantity to one or more other quantities by way of stating that-these quantities substantially satisfy or are substantially given by a mathematical relationship or equation. It is to be understood that "substantially" is a term of art, and is meant to convey the principle discussed above that mathematical relationships, equalities, and the like, cannot be met with exactness, but only within the tolerances of the technology available to a practitioner of the art under discussion.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. An apparatus comprising:
   an input port;
   an amplifier comprising an input port and an output port;
   a reset switch to couple the output port directly to the input port of the amplifier when closed;
   an offset-correction capacitor comprising a first terminal coupled to the input port of the amplifier and comprising a second terminal;
   a sampling switch to couple the second terminal of the offset-correction capacitor to the input port when closed;

a sampling capacitor comprising a first terminal coupled to the input port of the amplifier and comprising a second terminal coupled to the input port; and an additional switch to couple the output port to a second input port of the amplifier when closed.

2. The apparatus as set forth in claim 1, further comprising:

a signal generator circuit to open the sampling switch and to close the reset switch during a reset phase, and to close the sampling switch and to open the reset switch during a sampling phase.

3. The apparatus as set forth in claim 2, further comprising:

a transmission line coupled to the input port.

4. An apparatus comprising:

an input port;

an amplifier comprising an input port and an output port;

a reset switch to couple the output port to the input port of the amplifier when closed;

an offset-correction capacitor comprising a first terminal coupled to the input port of the amplifier and comprising a second terminal;

a sampling switch to couple the second terminal of the offset-correction capacitor to the input port when closed;

a sampling capacitor comprising a first terminal coupled to the input port of the amplifier and comprising a second terminal coupled to the input port; and a signal generator circuit to open the sampling switch and to close the reset switch during a reset phase, and to close the sampling switch and to open the reset switch during a sampling phase, the amplifier further comprising a second input port, the apparatus further comprising a fire switch to couple the output port to the second input port of the amplifier when closed, wherein the signal generator circuit closes the fire switch at the end of a sampling phase.

5. An apparatus comprising:

an input port;

an amplifier comprising an input port and an output port;

a reset switch to couple the output port directly to the input port of the amplifier when closed;

an offset-correction capacitor comprising a first terminal coupled to the input port of the amplifier and comprising a second terminal;

a sampling switch to couple the second terminal of the offset-correction capacitor to the input port when closed;

a sampling capacitor comprising a first terminal coupled to the input port of the amplifier and comprising a second terminal coupled to the input port;

a reference rail; and a second reset switch to couple the second terminal of the offset-correction capacitor to the reference rail when closed.

6. The apparatus as set forth in claim 5, further comprising:

a signal generator circuit to open the sampling switch and to close the first and second reset switches during a reset phase, and to close the sampling switch and to open the first and second reset switches during a sampling phase.

7. An apparatus comprising:

an input port;

an amplifier comprising an input port and an output port;

a reset switch to couple the output port directly to the input port of the amplifier when closed;

an offset-correction capacitor comprising a first terminal coupled to the input port of the amplifier and comprising a second terminal;

a sampling switch to couple the second terminal of the offset-correction capacitor to the input port when closed; and a sampling capacitor comprising a first terminal coupled to the input port of the amplifier and comprising a second terminal coupled to the input port, wherein the amplifier is a differential amplifier further comprising a second input port and a second output port, the apparatus further comprising:

a second input port;

a second reset switch to couple the second output port to the second input port of the amplifier;

a second offset-correction capacitor comprising a first terminal coupled to the second input port of the amplifier and comprising a second terminal;

a second sampling capacitor comprising a first terminal coupled to the second input port of the amplifier and a second terminal coupled to the second input port;

a second sampling switch to couple the second terminal of the second offset-correction capacitor to the second input port; and a third reset switch to couple the second terminal of the first offset-correction capacitor to the second terminal of the second offset-correction capacitor.

8. The apparatus as set forth in claim 7, wherein the first and second offset-correction capacitors are matched to each other, and the first and second sampling capacitors are matched to each other.

9. An apparatus comprising:

an input port;

an amplifier comprising an input port and an output port;

a reset switch to couple the output port to the input port of the amplifier when closed;

an offset-correction capacitor comprising a first terminal coupled to the input port of the amplifier and comprising a second terminal;

a sampling switch to couple the second terminal of the offset-correction capacitor to the input port when closed;

a sampling capacitor comprising a first terminal coupled to the input port of the amplifier and comprising a second terminal coupled to the input port, wherein the amplifier is a differential amplifier further comprising a second input port and a second output port, the apparatus further comprising:

a second input port;

a second reset switch to couple the second output port to the second input port of the amplifier;

a second offset-correction capacitor comprising a first terminal coupled to the second input port of the amplifier and comprising a second terminal;

a second sampling capacitor comprising a first terminal coupled to the second input port of the amplifier and a second terminal coupled to the second input port;

a second sampling switch to couple the second terminal of the second offset-correction capacitor to the second input port; and a third reset switch to couple the second terminal of the first offset-correction capacitor to the second terminal of the second offset-correction capacitor, wherein the first and second offset-correction capacitors are matched to each other, and the first and second sampling capacitors are matched to each other; and a first fire switch to couple the first output port to the second input port of the amplifier when closed; and a second fire switch to couple the second output port to the first input port of the amplifier when closed.

10. The apparatus as set forth in claim 9, further comprising a transmission line coupled to the first and second input ports.

11. An apparatus comprising:
a first input port having a first input voltage;
a second input port having a second input voltage;
an amplifier having an offset voltage, the amplifier comprising a non-inverting input port, an inverting input port, a first output port, and a second output port;
a first reset switch to couple during a reset phase the first output port directly to the non-inverting input port and a second reset switch to couple during a reset phase the second output port directly to the inverting input port;
a first offset-correction capacitor having a voltage drop and a second offset-correction capacitor having a voltage drop, the first and second offset-correction capacitors coupled to the amplifier so that the difference in the voltage drops of the first and second offset-correction capacitors at the end of a reset phase is indicative of the offset voltage;
a first sampling capacitor having a voltage drop and a second sampling capacitor having a voltage drop, the first and second sampling capacitors coupled to the first and second input ports and to the amplifier such that the difference in the voltage drops of the first and second sampling capacitors at the end of a reset phase is indicative of the voltage difference in the first and second input voltages;
a first sampling switch to couple during a sampling phase the first offset-correction capacitor in parallel with the first sampling capacitor;
a second sampling switch to couple during a sampling phase the second offset-correction capacitor in parallel with the second sampling capacitor; and
an additional switch to couple the output port to the second input port of the amplifier when closed.

12. The apparatus as set forth in claim 11, wherein the first and second offset-correction capacitors are matched to each other to have substantially the same capacitance, and the first and second sampling capacitors are matched to each other to have substantially the same capacitance.

13. An apparatus comprising:
a first input port having a first input voltage;
a second input port having a second input voltage;
an amplifier having an offset voltage, the amplifier comprising a non-inverting input port, an inverting input port, a first output port, and a second output port;
a first reset switch to couple during a reset phase the first output port to the non-inverting input port and a second reset switch to couple during a reset phase the second output port to the inverting input port;
a first offset-correction capacitor having a voltage drop and a second offset-correction capacitor having a voltage drop, the first and second offset-correction capacitors coupled to the amplifier so that the difference in the voltage drops of the first and second offset-correction capacitors at the end of a reset phase is indicative of the offset voltage;
a first sampling capacitor having a voltage drop and a second sampling capacitor having a voltage drop, the first and second sampling capacitors coupled to the first and second input ports and to the amplifier such that the difference in the voltage drops of the first and second sampling capacitors at the end of a reset phase is indicative of the voltage difference in the first and second input voltages;
a first sampling switch to couple during a sampling phase the first offset-correction capacitor in parallel with the first sampling capacitor;
a second sampling switch to couple during a sampling phase the second offset-correction capacitor in parallel with the second sampling capacitor, wherein the first and second offset-correction capacitors are matched to each other to have substantially the same capacitance, and the first and second sampling capacitors are matched to each other to have substantially the same capacitance;
a first fire switch to couple at the end of a sampling phase the first output port to the inverting input port; and
a second fire switch to couple at the end of a sampling phase the second output port to the non-inverting input port.

14. The apparatus as set forth in claim 12, further comprising a transmission line comprising a first conductor coupled to the first input port and a second conductor coupled to the second input port.

15. A system comprising:
a processing unit; and
a switch coupled to the processing unit, the switch comprising:
an input port;
an amplifier comprising an amplifier input port and an output port;
a reset switch to couple the output port directly to the amplifier input port when closed;
an offset-correction capacitor comprising a first terminal coupled to the amplifier input port and comprising a second terminal;
a sampling switch to couple the second terminal of the offset-correction capacitor to the input port when closed;
a sampling capacitor comprising a first terminal coupled to the amplifier input port and comprising a second terminal coupled to the input port; and
an additional switch to couple the output port to a second input port of the amplifier when closed.

16. The system as set forth in claim 15, the switch further comprising:
a signal generator circuit to open the sampling switch and to close the reset switch during a reset phase, and to close the sampling switch and to open the reset switch during a sampling phase.

17. The system as set forth in claim 16, further comprising:
a transmission line coupled to the input port.

18. A system comprising:
a processing unit; and
a switch coupled to the processing unit, the switch comprising:
an input port;
an amplifier comprising an amplifier input port and an output port;
a reset switch to couple the output port to the amplifier input port when closed;
an offset-correction capacitor comprising a first terminal coupled to the amplifier input port and comprising a second terminal;
a sampling switch to couple the second terminal of the offset-correction capacitor to the input port when closed; and
a sampling capacitor comprising a first terminal coupled to the amplifier input port and comprising a second terminal coupled to the input port;
a signal generator circuit to open the sampling switch and to close the reset switch during a reset phase, and to close the sampling switch and to open the reset switch during a sampling phase, the amplifier further comprising an inverting amplifier input port, the apparatus further comprising a fire switch to couple the output port to the inverting amplifier input port when closed, wherein the signal generator circuit closes the fire switch at the end of a sampling phase.

* * * * *